United States Patent [19]

Nagashima

[11] Patent Number: 4,569,745
[45] Date of Patent: Feb. 11, 1986

[54] SPUTTERING APPARATUS
[75] Inventor: Setsuo Nagashima, Kawasaki, Japan
[73] Assignee: Fujitsu Limited, Kawasaki, Japan
[21] Appl. No.: 539,180
[22] Filed: Oct. 5, 1983
[30] Foreign Application Priority Data Oct. 5, 1982 [JP] Japan .............................. 57-174778
Oct. 5, 1982 [JP] Japan .......................... 57-151138[U]

[51] Int. Cl.$^4$ .............................................. C23C 15/00
[52] U.S. Cl. .................................. 204/298; 204/192 R
[58] Field of Search .......................................... 204/298

[56] References Cited

U.S. PATENT DOCUMENTS 4,419,201 12/1983 Levinstein et al. .................. 204/298

FOREIGN PATENT DOCUMENTS 2115590 10/1972 Fed. Rep. of Germany ...... 204/298

OTHER PUBLICATIONS

Vossen et al. R.C.A. Review Jun. 1970 pp. 293–305.
Entner et al. IBM Tech. Bulletin 18(1975) pp. 1284–1285.
Lester et al. IBM Tech. Bulletin 20(1977) pp. 1177–1178.
Lue Vacuum 32(1982) pp. 363–367.
Nathanson et al. J. O. S. A. 29(1939) pp. 417–426.

Maissel et al. Handbook of Thin Film Technology McGraw-Hill, N.Y., N.Y., pp. 4–36.
Vossen et al., (II) Thin Film Processes; Academic Press, N.Y., N.Y., 1978, p. 33.

*Primary Examiner*—Arthur P. Demers
*Attorney, Agent, or Firm*—Staas & Halsey

[57] ABSTRACT

A sputtering apparatus having a vacuum treatment chamber, a backing plate arranged within the chamber, a sputtering target secured to the backing plate, evacuation means and a voltage source for applying a voltage to the sputtering target. The peripheral portion of the backing plate adjacent to the sputtering target is covered with a material having a high heat resistance temperature and excellent electrical insulating properties or the same material as the material of the sputtering target. The peripheral edge of the sputtering target can also be made larger than the peripheral edge of the backing plate so that the peripheral portion of the backing plate adjacent to the sputtering target is covered with or hidden by the sputtering target. In this sputtering apparatus, at least the peripheral portion of the backing plate adjacent to the sputtering target is not sputtered, and therefore, a metal film formed on a substrate by sputtering is not contaminated and this metal film is, therefore, easily dry-etched.

11 Claims, 10 Drawing Figures

SPUTTERING APPARATUS

FIELD OF THE INVENTION

This invention relates to a sputtering target. More particularly, it relates to a sputtering apparatus which is suitable for forming a metal film that can easily be dry-etched.

DESCRIPTION OF THE PRIOR ART

In the production of a semiconductor integrated circuit, it is necessary to perform an etching process on semiconductor material of 1 micron to submicrons (several-tenths of 1 micron) by using a fine mask. Recently, a dry etching process has been developed as a means for meeting this requirement. However, various problems not encountered in the conventional wet etching process arise.

In order to clarify these problems, the conventional sputtering apparatus and the backing plate and target used in this apparatus will now be described with reference to FIGS. 1 through 3.

Figure 1:
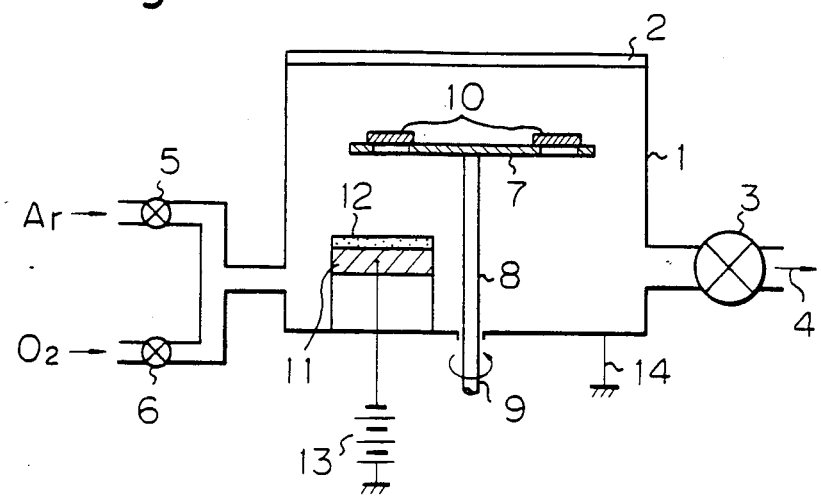
FIG. 1 is a diagram of a conventional sputtering apparatus.

Referring to FIG. 1, showing a conventional sputtering apparatus, a bell jar 1 has a lid in the upper portion thereof and is connected to evacuation means, such as a vacuum pump; through a valve 3. Air is removed through a passage 4 so as to produce vacuum within a chamber of the bell jar 1. Argon (Ar) and oxygen gas (O₂) are introduced into the bell jar 1 through valves 5 and 6, respectively.

A substrate holder 7 is arranged in the bell jar 1, and this substrate holder 7 is secured to a rotating shaft 8 and is rotated in the direction of an arrow 9 by a motor or the like disposed outside the bell jar 1. A substrate 10 composed of glass or another material is placed on the substrate holder 7 and a target 12 to be sputtered onto the substrate 10, for example, chromium (Cr), is secured to a backing plate 11. A negative voltage of several hundred volts is applied to the sputtering target 12 from a voltage source 13. The voltage of the chamber 1 is maintained at a ground 14.

In the above-mentioned structure, the negative voltage is applied to the sputtering target 12 to generate a glow discharge between the chamber which is connected to ground and the backing plate to produce a plasma state. Argon, introduced into the atmosphere of the chamber, is ionized and by the shock caused when ionized argon impinges against the target 12 maintained at a negative potential, Cr is emitted and sputtered on the substrate 10 to form a film of Cr.

When the metal film formed by this method is etched with an aqueous acid solution as in the case of the conventional wet etching process, no particular problem arises. In the case of the recently adopted dry etching process, however, the etching time is abnormally prolonged and in the worst case, partial non-etching is caused.

When these problems were examined, it was found that Cu, constituting the backing plate, is contained in the metal film sputtered onto the substrate. The etching time for Cu is abnormally long.

Figure 2:
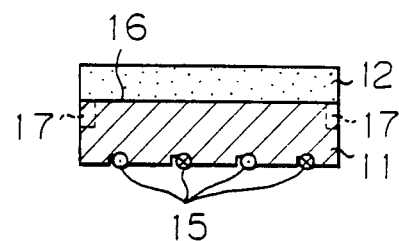
FIG. 2 is a sectional side view of an example of the combination of a target and a backing plate, used in the conventional sputtering apparatus shown in FIG. 1.
Figure 3:
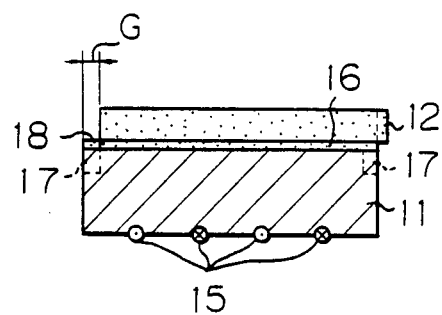
FIG. 3 is a sectional side view of another example of the above combination.

Referring to FIG. 2, the backing plate 11 ordinarily has a disc-like shape and a cooling pipe 15 is laid out on the backing plate 11 to cool the backing plate 11. Chromium, for example, is selected as the target material 12 and the backing plate 11 is integrally secured to the target material 12 by using a metal 16 such as indium. Copper or the like is ordinarily used for the backing plate 11. In the apparatus shown in FIG. 2, the diameter of the backing plate 11 is the same as that of the target material 12 and they are integrally secured to each other. The problem with the apparatus shown in FIG. 2 is that ionized argon impinges against a peripheral portion 17 of the backing plate 11 and molecules of copper are sputtered. Accordingly, not only chromium but also copper is sputtered onto the substrate 10. FIG. 3 illustrates the case in which a slippage G of about 1 mm, occurs because of a divergence between the backing plate 11 and the target material 12 when the target material 12 is secured to the backing plate 11 by using a metal such as indium. In this case, ionized argon impinges also against the indium metal 16, that is, the slippage portion 18, to release molecules of indium. Furthermore, the backing plate 11 contains not only copper but also impurities such as iron, and molecules of these impurities are emitted and sputtered on the substrate.

It also has been found that dry etching of a metal film containing impurities such as copper is difficult.

SUMMARY OF THE INVENTION

It is a primary object of the present invention to provide a sputtering apparatus in which the defects of the conventional apparatus are eliminated by providing a sputtering target which is arranged so that at least the peripheral portion of a backing plate adjacent to the sputtering target is not sputtered and which is suitable for forming a metal film that can easily be dry-etched.

The present invention is concerned with an improvement in the sputtering apparatus comprising a vacuum treatment chamber, a sputtering target secured to a backing plate arranged within said chamber, evacuation means and means for applying a voltage to the sputtering target.

In accordance with one aspect of the improvements of the present invention, at least the peripheral portion of the backing plate adjacent to the sputtering target is covered with a material having a high heat resistance temperature and an excellent electrical insulating property, or the same material as the material of the sputtering target.

In accordance with another aspect of the improvement of the present invention the peripheral edge of the sputtering target is made larger than the peripheral edge of the backing plate, so that the peripheral portion of the backing plate adjacent to the sputtering target is covered with and hidden by the sputtering target.

DESCRIPTION OF THE PREFERRED EMBODIMENTS

Several examples of the combination of a target and a backing plate, used in the sputtering apparatus of the present invention, will now be described with reference to the accompanying drawings.

Figure 4A:
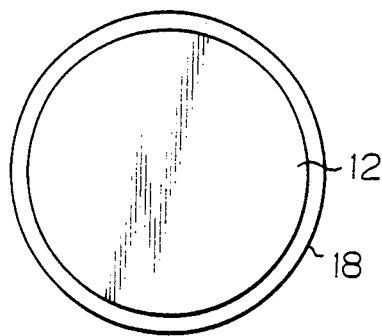
FIGS. 4A and 4B are plan and sectional side views, respectively, of an example of the combination of a target and a backing plate, used in the sputtering apparatus of the present invention.
Figure 4B:
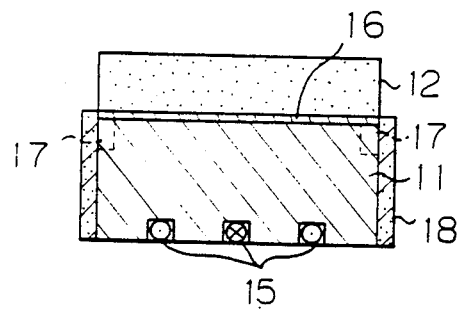

Referring to FIGS. 4A and 4B, a material 18 forming a sleeve having an annular shape, an inner diameter or dimensions substantially equal to the outer diameter or dimensions of a backing plate 11, and which has excellent electrical insulating properties and a high heat resistance temperature, is fitted on the peripheral portion of the backing plate 11. This material 18 may be the same as the material to be sputtered. The fitting may be bind fitting or free fitting, and a target 12 composed of, for example, chromium, is bonded to the top face of the backing plate 11 so that copper is not exposed. The bonding is effected with the aid of a metal 16 such as indium. If this arrangement is adopted, the portion 17, where copper is sputtered by ionized molecules of argon or the like in the conventional technique is completely covered with the non-conductor and is not sputtered. Accordingly, only the material to be sputtered is sputtered on the substrate.

Because the material 18 is an excellent electrical insulating material and having a high heat resistance temperature, there can be preferably used materials which have an insulation resistance of at least 10 k·Ω/cm and a softening point of at least 1,000° C. Such materials include, for example, ceramic, porcelain, alumina, and quartz glass. The thickness of the target 12 is not particularly critical. For example, the thickness of the target may be about 6 mm.

A pipe 15 for circulation of cooling water is laid out on the backing plate 11 on the side opposite to the side to be secured to the target 12.

Figure 5A:
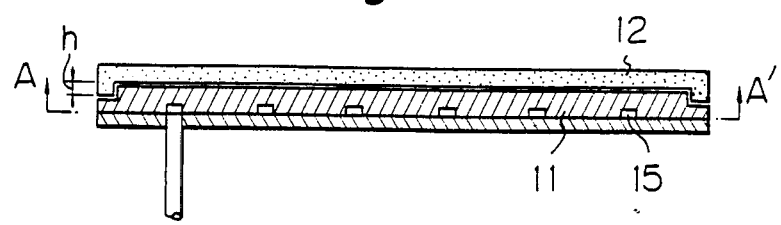
FIG. 5A is a sectional side view of another example of the combination of a target and a backing plate, used in the sputtering apparatus of the present invention.
Figure 5B:
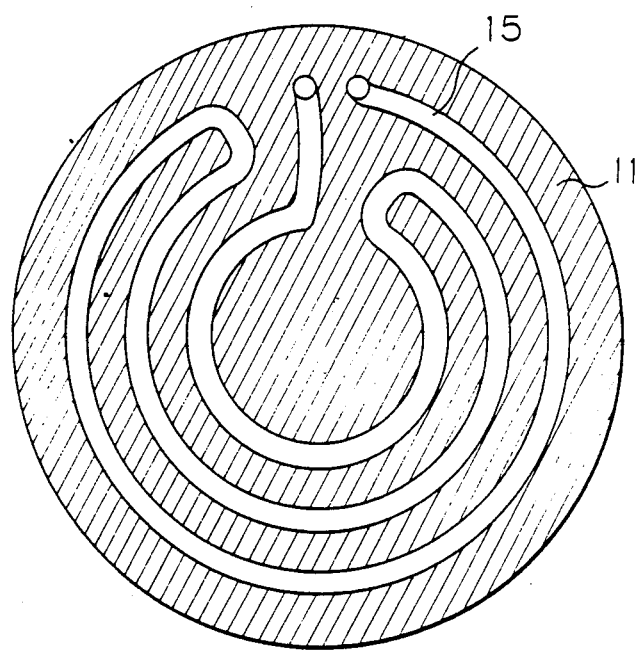
FIG. 5B is a view of the section taken along the line A—A' in FIG. 5A.

In the combination of the target 12 and backing plate 11 shown in FIGS. 5A and 5B, the peripheral portion of the backing plate 11 adjacent to the sputtering target 12 is covered with the peripheral edge of the target 12. Namely, the target 12 having a lip around the edge or a tray-like shape is secured to the top face of the backing plate 11 through a bonding metal 16. The height h of the portion covered with the peripheral edge of the target 12 in the vicinity of the top end of the peripheral portion of the backing plate 11 is appropriately determined depending on the gap between the target 12 and a plasma shield ring (not shown) arranged in close proximity to the periphery of the target 12. For example, when the gap between the plasma shield ring and target is about 10 mm, the height h is adjusted to about 3 mm. As the gap is increased the height h is also increased.

In the example shown in FIGS. 5A and 5B, the cooling water pipe conduit for the backing plate 11 is formed within the backing plate 11. The cooling conduit 15 shown in FIGS. 5A and 5B has a higher cooling effect than the cooling conduit 15 shown in FIG. 4B.

Figure 6A:
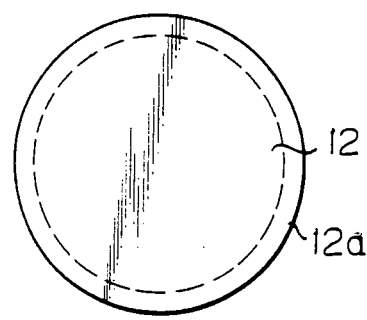
FIGS. 6A and 6B are plan and sectional side views, respectively, of still another example of the combination of a target and a backing plate, used in the sputtering apparatus of the present invention.
Figure 6B:
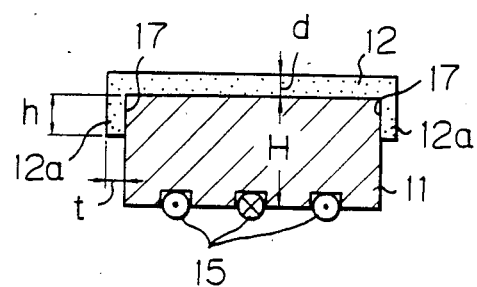

In an example of the combination of the target 12 and backing plate 11 shown in FIGS. 6A and 6B, a target with a lip around the edge, or a tray-like target 12 is arranged so that the peripheral edge of the target 12 radially projects beyond the peripheral edge of the backing plate 11, by 2 to 3 mm and the top end 17 of the peripheral portion of the backing plate 11, which is readily sputtered, is thus covered with the target 12. The height h of the projection 12a may be, for example, 2 to 3 mm, and the thickness t may be, for example, about 1.5 to about 2 mm.

Figure 7:
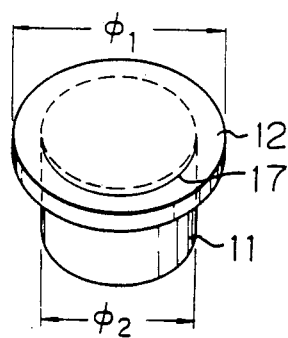
FIG. 7 is a perspective view of still another example of the combination of a target and a backing plate, used in the present invention.

In an example of the combination of the target 12 and backing plate 11 shown in FIG. 7, the diameter $\phi 1$ of the target 12 is made larger than the diameter $\phi 2$ of the backing plate 11, and the peripheral portion 17 of the backing plate 11 which is readily sputtered is covered from the top face with the target 12. As shown in FIG. 7, the peripheral edge of the target 12 may be made larger than the peripheral edge of the backing plate 11, so that the peripheral portion of the backing plate adjacent to the target is covered with the target.

In the foregoing examples, the technique of forming a Cr film on a glass substrate has been illustrated, but the present invention is not limited to this embodiment and the present invention can be applied to formation of a film of such a metal as Al or Au on a semiconductor wafer.

If the sputtering apparatus of the present invention is adopted, the portion of the backing plate, which is readily sputtered, that (is, the peripheral portion of the backing plate adjacent to the sputtering target) is covered with a material having excellent insulating properties and a high heat resistance temperature. The sputtering target may also be formed of the same material as the material of the sputtering target. Accordingly the metal film formed by sputtering is not contaminated with copper or other metal emitted from the backing plate, and a metal film which is readily dry-etched can be obtained.

I claim:

1. A sputtering apparatus comprising:
   a vacuum treatment chamber;
   a backing plate arranged within said vacuum treatment chamber, said backing plate having a peripheral portion;
   a sputtering target secured to said backing plate;
   evacuation means, operatively connected to said vacuum treatment chamber, for evacuating the vacuum treatment chamber;
   means for applying a voltage to said sputtering target; and
   a covering material covering at least the peripheral portion of the backing plate adjacent to the sputtering target, said covering material being in contact with the peripheral portion of the backing plate, and being a material having a high heat resistance temperature and an excellent electrically insulating property or being the same material as the material of the sputtering target.

2. A sputtering apparatus as set forth in claim 1, wherein said sputtering target has a tray-like shape and is secured to said backing plate so that said peripheral edge of said sputtering target covers at least a part of said peripheral portion of the backing plate adjacent to said sputtering target.

3. A sputtering apparatus as set forth in claim 1, wherein the entire peripheral portion of the backing plate is covered with a heat resistant and electrically insulating material.

4. A sputtering apparatus as set forth in claim 1, wherein the material having a high heat resistance temperature and an excellent electrically insulating material is selected from the group consisting essentially of ceramic, porcelain, alumina and quartz glass.

5. A sputtering apparatus as set forth in claim 1, wherein said sputtering target has a first face and a second face, said sputtering target is secured to said first face of said backing plate, and a pipe for circulating cooling water is arranged on said second face of said backing plate.

6. A sputtering apparatus as set forth in claim 1, wherein a conduit for circulation of cooling water is formed within the backing plate.

7. A sputtering apparatus, comprising:
a vacuum chamber;
means, operatively connected to said vacuum chamber, for evacuating said vacuum chamber;
a backing plate arranged within said vacuum chamber, said backing plate having a peripheral portion;
a sputtering target having a securing face and a target face, said securing face being secured to said backing plate, said securing face having a lip formed at the edge thereof, said lip covering and being in contact with a part of said peripheral portion of said backing plate; and
means for applying a voltage to said sputtering target.

8. A sputtering apparatus, comprising:
a vacuum chamber;
means, operatively connected to said vacuum chamber, for evacuating said vacuum chamber;
a backing plate arranged within said vacuum chamber, said backing plate having a peripheral portion and an outer diameter;
a sleeve having an annular shape and an inner diameter substantially equal to said outer diameter of said backing plate, said sleeve being formed of a material which is an electrical insulator and which has a high heat resistance temperature, said sleeve being fitted over and in contact with said peripheral portion of said backing plate;
a sputtering target secured to said backing plate; and
means for applying a voltage to said sputtering target.

9. A sputtering apparatus according to claim 8, wherein said sleeve is formed of a material selected from a group consisting of ceramic, porcelain, alumina and quartz.

10. A sputtering apparatus according to claim 8, wherein said sleeve is formed of a material which is the same as the material forming said sputtering target.

11. A sputtering apparatus according to claim 8, wherein said sputtering target has a first face and a second face, said sputtering target is secured to said first face of said backing plate, and a pipe for circulating cooling water is arranged on said second face of said backing plate.

* * * * *